United States Patent
Lin et al.

(10) Patent No.: US 11,430,711 B2
(45) Date of Patent: Aug. 30, 2022

(54) CARBON NANOTUBE ENHANCED SILVER PASTE THERMAL INTERFACE MATERIAL

(71) Applicant: Aegis Technology Inc., Santa Ana, CA (US)

(72) Inventors: Zhigang Lin, Santa Ana, CA (US); Chunhu Tan, Santa Ana, CA (US); Shuyi Chen, Santa Ana, CA (US)

(73) Assignee: Aegis Technology Inc., Santa Ana, CA (US)

( * ) Notice: Subject to any disclaimer, the term of this patent is extended or adjusted under 35 U.S.C. 154(b) by 358 days.

(21) Appl. No.: 16/696,105

(22) Filed: Nov. 26, 2019

(65) Prior Publication Data

US 2021/0159144 A1    May 27, 2021

(51) Int. Cl.
| | |
|---|---|
| *H01L 23/34* | (2006.01) |
| *H01L 23/373* | (2006.01) |
| *C01B 32/158* | (2017.01) |
| *C01G 5/00* | (2006.01) |
| *C01G 19/00* | (2006.01) |
| *H01L 21/48* | (2006.01) |
| *B82Y 30/00* | (2011.01) |
| *B82Y 10/00* | (2011.01) |

(52) U.S. Cl.
CPC ........ *H01L 23/3737* (2013.01); *C01B 32/158* (2017.08); *C01G 5/00* (2013.01); *C01G 19/00* (2013.01); *H01L 21/4882* (2013.01); *B82Y 10/00* (2013.01); *B82Y 30/00* (2013.01); *C01P 2004/61* (2013.01); *C01P 2004/62* (2013.01); *C01P 2004/64* (2013.01)

(58) Field of Classification Search
CPC ............. H01L 21/4882; H01L 23/3737; H01L 51/0048; B82Y 30/00; C01B 32/158; C01G 5/00; C01G 19/00
USPC ........................................................ 257/712
See application file for complete search history.

(56) References Cited

U.S. PATENT DOCUMENTS

| | | | |
|---|---|---|---|
| 6,350,488 B1 | 2/2002 | Lee et al. | |
| 7,148,512 B2 * | 12/2006 | Leu ........................ | H01L 23/373 427/430.1 |
| 7,183,003 B2 | 2/2007 | Leu et al. | |
| 9,024,436 B2 * | 5/2015 | Zhao ....................... | H01L 24/27 257/713 |
| 9,550,903 B2 | 1/2017 | Mor et al. | |

(Continued)

*Primary Examiner* — Brook Kebede
(74) *Attorney, Agent, or Firm* — Charles H Jew

(57) ABSTRACT

A high performance, lead free, Ag paste thermal interface material (TIM) for die attachment and substrate bonding in electronic packaging includes: (i) multiscale silver particles, (ii) metal-coated carbon nanotubes (CNTs), (iii) a polymer, and (iv) a liquid carrier. The multiscale silver particles and metal-coated carbon nanotubes, which function as hybrid filler components, are uniformly dispersed within the TIM composition. The sintered TIM exhibits high density, high mechanical strength, and high thermal conductivity. The components of the liquid carrier including the solvent, binder, surfactants, and thinner are completely evaporated or burned off during sintering. Sintering of the TIM can be conducted at a relatively low temperature, without or with very low (<0.1 MPa) pressure, in open air and without vacuum or inert gas protection. The TIM can be utilized in substrate bonding not only on conventional metal-plated surfaces but also bare Cu substrate surfaces.

24 Claims, 7 Drawing Sheets

(56) References Cited

U.S. PATENT DOCUMENTS

| | | | |
|---|---|---|---|
| 2004/0262740 A1* | 12/2004 | Matayabas, Jr. | H01L 23/3733 |
| | | | 257/706 |
| 2005/0045855 A1 | 3/2005 | Tonapi | |
| 2005/0061496 A1 | 3/2005 | Matabayas | |
| 2006/0083694 A1* | 4/2006 | Kodas | B01J 13/0043 |
| | | | 424/490 |
| 2007/0051773 A1* | 3/2007 | Ruchert | H01L 23/4275 |
| | | | 228/101 |
| 2008/0023665 A1 | 1/2008 | Weiser | |
| 2008/0073776 A1* | 3/2008 | Suh | H01L 23/3736 |
| | | | 257/706 |
| 2009/0232991 A1* | 9/2009 | Wang | H01L 23/433 |
| | | | 427/294 |
| 2010/0172101 A1 | 7/2010 | Yao | |
| 2010/0196659 A1 | 8/2010 | Razeeb | |
| 2010/0328896 A1* | 12/2010 | Shaddock | B82Y 40/00 |
| | | | 361/704 |
| 2012/0276327 A1* | 11/2012 | Cola | H01L 51/102 |
| | | | 428/119 |
| 2013/0256868 A1* | 10/2013 | Aliyev | H01L 23/42 |
| | | | 257/713 |
| 2014/0246770 A1* | 9/2014 | Jha | H01L 24/16 |
| | | | 257/712 |
| 2015/0206821 A1 | 7/2015 | Zhao | |
| 2017/0144220 A1* | 5/2017 | Suganuma | C09D 7/68 |
| 2017/0190579 A1 | 7/2017 | Cola et al. | |
| 2017/0227304 A1* | 8/2017 | Esseghir | F28F 13/18 |
| 2019/0301814 A1 | 10/2019 | Lin et al. | |

\* cited by examiner

CARBON NANOTUBE ENHANCED SILVER PASTE THERMAL INTERFACE MATERIAL

The invention was made with Government support under SBIR Grant No. FA8650-19-P-5006 awarded by the U.S. Air Force to Aegis Technology Inc. The Government has certain rights to the invention.

FIELD OF THE INVENTION

The present invention generally relates to a class of lead-free thermal interface materials which is formulated as a silver paste that includes multiscale silver particles and nano-metal coated carbon nanotubes. The silver paste is used in die attachment, substrate bonding, and electronic packaging.

BACKGROUND OF THE INVENTION

Wide-band gap (WBG) power devices based on silicon carbide (SiC) and gallium nitride (GaN) semiconductors are dictating the pace of high temperature power electronics development. WBG semiconductor power devices achieve high power densities and faster switching speeds than their silicon counterparts. Furthermore, WBG devices operate at higher junction temperatures so that it is possible to employ more volumetrically efficient thermal management schemes. These attributes can advance system miniaturization to develop novel small-footprint system architectures. However, in order to fully realize these potential benefits, it is necessary to develop highly capable thermal interface materials (TIMs) and the associated electronic packaging technology for die attachment and substrate/heatsink bonding. This will produce WBS power devices with high/wide operation temperatures, high thermal conductivities and enhanced mechanical strengths at room and elevated temperatures. The TIMs and related packaging techniques can be incorporated into low-cost, scalable processes.

Silver paste is used extensively in high performance TIMs and associated bonding processes as a die attachment material because of its excellent characteristics, such as the high melting temperature (960° C.), low sintering temperature (250-300° C.), and high electrical ($4.1 \times 10^7$ S/m) and thermal conductivities (240 W/m·K). Several types of Ag-based die-attachment materials or pastes based on Ag micro and nanoparticles and Ag oxide particles have been investigated for the use in power devices packaging. These materials provide good thermal performance but, in order to obtain reliable Ag joints in die attachment, several preconditions are generally necessary, including: (1) metallized substrate surfaces coated with a Ni/Au (or Ag) layer to match the Ag sintering process, (2) additional pressure applied on die/chip, and (3) inert gas environments during Ag paste sintering. These preconditions with existing Ag paste TIMs complicate the assembly process and raise costs. The industry is in need of innovative Ag paste TIMs that can address these issues and therefore enable the development of more advanced electronic packaging technologies for WBG-based power electronics and other applications.

SUMMARY OF THE INVENTION

The present invention is based in part on the development of a high performance, lead free, Ag paste TIM that incorporates metal-coated carbon nanotubes. In one aspect, the invention is directed to a thermal interface material composition, that is particularly suited for use in die attachment and substrate bonding in electronic packaging, and that includes: (i) multiscale silver particles, (ii) metal-coated carbon nanotubes (CNTs), (iii) a polymer, and (iv) a liquid carrier.

The multiscale silver particles and metal-coated carbon nanotubes, which function as hybrid filler components, are uniformly dispersed within the TIM composition. Sintering removes the liquid carrier from the TIM composition.

In another aspect, the invention is directed to an electronic packaging component that includes:
a heat producing component of a semiconductor device,
a heat spreader or heat sink, and
a thermal interface material interposed between the heat producing component and the heat spreader or heat sink, wherein the thermal interface material comprises (i) multiscale silver particles, and (ii) metal-coated carbon nanotubes and (iii) a polymeric matrix wherein the multiscale silver particles and the metal-coated carbon nanotubes are dispersed in the matrix.

In yet another aspect, the invention is directed to a method of increasing heat transfer that includes:
positioning a heat producing component in contact with a thermal interface material that comprises (i) multiscale silver particles, (ii) metal-coated carbon nanotubes, (iii) a polymer, and (iv) liquid carrier; and
positioning a heat sink in contact with the thermal interface material.

The multiscale Ag particles and metal-coated carbon nanotubes are uniformly distributed in the liquid carrier. The fillers can be sintered so that the TIM exhibits a relatively high density (i.e., low porosity), high mechanical (shear) strength, and high thermal conductivity. The components of the liquid carrier including the solvent, surfactants, and thinner are completely evaporated or burned off during sintering, otherwise remaining residues can adversely affect the bonding strength. Additionally, sintering of the TIM can be conducted at a relatively lower temperature (250° C.), without (or with very low, <0.1 MPa) pressure, in open air (without vacuum or inert gas protection). The TIM is used in electronic packaging including die attachments and substrate bonding on conventional metal-plated (e.g., Au—, Ag—, Ni-plated) surfaces and on bare Cu surfaces with exceptional thermal, mechanical, and electrical properties, which enables simplified processing, higher efficiency, and lower costs.

DETAILED DESCRIPTION OF PREFERRED EMBODIMENTS

Formulation of Thermal Interface Composition

Figure 1:
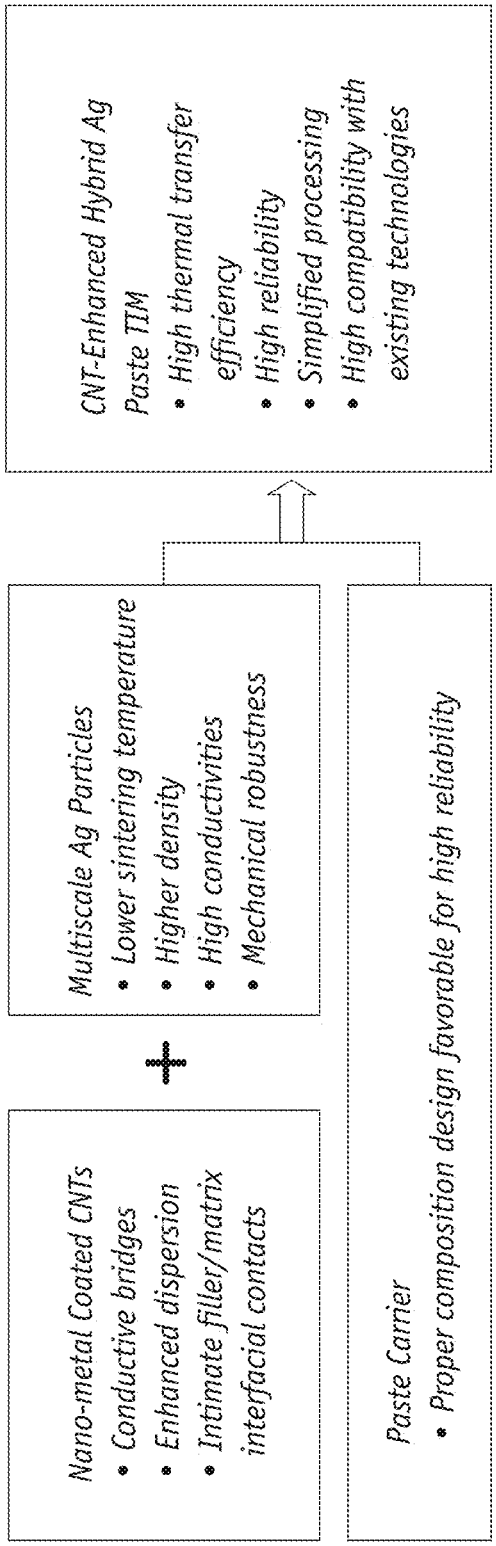
FIG. 1 illustrates the formulation of the enhanced Ag paste TIM using multiscale Ag particles and metal-coated CNTs.

As depicted in FIG. 1, lead-free CNT-enhanced Ag paste TIMs of the present invention contain nano-metal coated CNTs and multiscale Ag particles that both function as fillers. These fillers are mixed in a liquid paste carrier (or vehicle) to form a novel class of hybrid Ag paste TIMs for WBG die attachment and electronic packaging applications.

The multiscale Ag particles consist of Ag particles having diameters that range from nano (nm), submicron (sub-μm) to micron (μm). That is, the multiscale Ag particles contain silver particles in all three size ranges. Preferred multiscale Ag particles include nano-scale particles (10-100 nm), sub-micron-scale particles (0.1-1 μm) and micron-scale particles (1-10 μm) with the weight ratio that range from (1-5) to (1-9) to (1-9), respectively. The multiscale Ag particles typically comprise 50 wt % to 95 wt % of the Ag paste TIM. In addition, Ag particles with various shapes can be used, such as spheres, wires, rods, tubes, stars, cubes, and flakes. By using multiscale particles, the contacts between Ag particles are enhanced due to volume diffusion by the different particle shapes.

The metal-coated CNTs comprise single-walled or multi-walled carbon nanotubes that are coated with metal particles. Preferred metal particles exhibit high thermal and electrical conductivities and they include, for example, nano-size Ag, Ni, Cu, and Au particles. The metal coating modifies the CNTs' surface properties and reduces the surface energy, which prevents aggregation of the CNTs and thus enhances their dispersion within the Ag paste. In addition, the presence of the metal-coated CNTs promotes intimate interfacial contacts. Better interfacial structure between the CNT filler and polymer matrix is achieved in the subsequent sintered joint. Moreover, originally separated Ag particles are connected by CNTs bridges which facilitates their diffusion which attributes to denser structures after sintering.

The nanoparticles on the surfaces of metal-coated CNTs will significantly improve the dispersion of CNTs. The nanoparticles preferably range from 5 nm to 20 nm in diameter. Moreover, the electrical conductivity of the CNTs is also enhanced although the improvement is not as significant as the improvement in the electrical conductivity. The reason might be that the metal (e.g., Ag) coated CNTs create a percolating network that promotes electrical conductance but not thermal conductance because of the difference in the nature of conduction between electrons and photons. It is expected that metal-coated CNTs that are saturated with nanoparticles will exhibit higher levels of improvements in thermal and electrical conductivities relative to partially saturated CNTs. Uniform and dense Ag-coated CNTs are described herein to demonstrate their enhancements on the interactions of fillers-to-fillers and fillers-to-matrix in the Ag paste TIMs.

Metal-coated CNTs are much more readily dispersed within the Ag paste TIM than pristine non-coated CNT counterparts so that the unique mechanical, thermal, and electrical properties of CNTs can be imparted in the sintered Ag-metal layers. The metal-coated CNTs typically comprise 1 wt % to 15 wt % of the Ag paste TIM. The combined multiscale Ag particles and metal-coated CNTs fillers typically comprise 50 wt % to 95 wt % of the Ag paste TIM wherein the metal-coated CNTs comprises less than 15 wt % of the combined total filler weight. The composite fillers combining both multiscale Ag particles and metal-coated CNTs provide high thermal conductivity and high shear strength. Furthermore, the resultant metal matrix composites have demonstrated the ability to "self-heal" should they be strained to electrical failure, due to the presence of the one-dimensional CNTs.

A method of preparing the metal-coated CNTs comprises an initial step of surface treatment and cleaning of the CNTs, which are commercially available. The synthesis of CNTs are described in U.S. Pat. No. 6,350,488 to Lee et al., which is incorporated herein by reference. The single-walled or multi-walled CNTs generally have average outside diameters of about 130 nm and length in the range of 0.5-10 μm. The CNTs are suspended in a 1 wt % aqueous sodium dodecyl sulfate (SDS) solution, and the mixture is then ultrasonicated in a bath for 90 minutes. The suspension is centrifuged for 30 minutes to separate impurities and large bundles. Acetone is then added to the supernatant to flocculate and remove the CNTs from the suspension. The de-bundled CNTs are filtered through a Millipore polytetrafluoroethylene membrane filter with a pore diameter of 1.2 and then washed with methanol to remove the surfactant. After this procedure, organic contaminants, dirt, and other contaminants will have been removed from the fibers. The CNTs are also disentangled which allow the surface of each CNT to be uniformly exposed to the processing solution in the next steps.

Next is the sensitization step where the CNTs are pre-treated to improve the adhesion and bonding between the metal coating and fiber surface. For silver nano-coating, the CNTs are sensitized using a sensitizer solution which consists of propyl alcohol (20 wt %), hydrochloric acid (5 wt %), stannous chloride (5 wt %), palladium chloride (3 wt %) and distilled water (67 wt %). The sensitized CNTs are then separated from the solution via vacuum filtration. The collected CNTs are washed and filtered again to remove residues.

After sensitization, the CNTs undergo electroless plating using a silver solution, activator solution and reducer solution. These solutions are commercially available in concentrated form. The concentrated silver solution consists of 27 wt % silver diamine, which is formed from silver nitrate and ammonia, 12 wt % ammonium hydroxide, and 61 wt % distilled water. The concentrated activator solution contains 10 wt % sodium hydroxide, 5 wt % ammonium hydroxide, and 85 wt % distilled water. Finally, the concentrated reducer solution consists of 12 wt % polydric alcohol, 1 wt % formaldehyde, and 87 wt % distilled water. The three concentrated solutions are typically diluted with distilled water to a dilution ratio in the range of 1:20 to 1:45 and preferably to a ratio of about 1:30 and thereafter the diluted solutions are mixed to form a mixture into which the sensitized CNTs are dispersed. Suitable reaction temperature (in the range of 20-30° C.) and reaction time (in the range of 1-6 minutes) are chosen to achieve the desired nano-coating with controlled coating areas (partially or fully) and/or coating thicknesses (in the range of 5-100 nm). To prevent agglomeration of the microfibers, simultaneous low mechanical stirring and strong sonication will be applied during the coating process. This will effectively prevent agglomeration of the microfibers without affecting the coating quality. The coating process is stopped by adding distilled water into the reaction solution. Typically, the amount of water needed is more than ten times the volume of the reaction solution.

The final step of the method is filtering and drying. The coated single or multiwall CNTs are separated and filtered through a Millipore polytetrafluoroethylene membrane filter with a pore diameter of 1.2 μm, and rinsed thoroughly in distilled water and dried in hot air (40° C.-50° C.) to achieve good adhesion of the Ag nano-coatings.

The liquid carrier comprises fluid in which the multiscale silver particles, metal-coated carbon nanotubes, and other additives are dispersed to form the silver paste TIM. Carrier liquids can include a mixture of a variety of different agents, such as surfactants, co-solvents, and viscosity modifiers. A preferred liquid carrier is an organic solvent such as alcohol. A particularly preferred liquid carrier includes α-terpineol, a surfactant and a thinner to enhance the wetting of the Ag-based filler and also the fluidity of the polymer matrix. Suitable surfactants such as, for example, fish oil, oleic acid, and octanoic acid surround the multiscale silver particle and metal-coated carbon nanotube fillers to prevent them from agglomeration. The viscosity of the final liquid carrier could be adjusted by using short hydrocarbon chain thinners such as, for example, toluene. The liquid carrier typically comprises 5 wt % to 50 wt % of the Ag paste TIM, before being sintered.

The polymers for the novel Ag paste TIM comprise long hydrocarbon chains that form a matrix that bind or support the dispersed multiscale silver particles, metal-coated carbon nanotubes. Preferred polymers include, for example, ethylene cellulose (EC) and polyvinylpyrrolidone (PVP), and 2-ethylhexanoate. The polymers typically comprise 0.5 wt % to 5 wt % of the Ag paste TIM, before being sintered. The solvent, surfactants, and viscosity modifiers are burned off during the Ag paste sintering process (250° C.) without any residue left off to ensure good bonding strength.

The Ag paste TIM of the present invention can include a low-melting-temperature sintering aid phase to facilitate the sintering of the Ag paste at relatively low temperature of about 250° C. Tin is particularly preferred of it slow melting temperature (232° C.) and the potential of SnAg-based alloys (in particular for those SnAg nanophases) enhances the strength of the sintered Ag-based pastes. Moreover, it is also expected that owning to the reduced sintering temperature, Sn nanoparticles introduced into the Ag pastes can benefit the reparation of those cracked (or peeled off) Ag joining layers either for those die attachments or for those joints between baseplates and heat spreaders. The Sn particles preferably have diameters that range from 1 nm to 50 nm and comprise less than 10 wt % of the total filler content that includes the multiscale Ag particles, metal-coated CNTs and Sn particles.

After sintering, the packing density of the fillers can be maximized because the voids between larger particles are filled by smaller particles. The sintered silver paste TIM exhibit high density. Moreover, with the homogeneous distribution of multiscale silver particles and metal-coated carbon nanotubes in the matrix, filler has excellent performance because of the improved mechanical, thermal and electrical properties.

The lead-free carbon nanotube enhanced Ag paste TIM of the present invention has a wide working temperature range (−60 to 300° C.), high mechanical strength (>30 MPa) and high thermal conductivity (>70 W/m·k). The bonding process using this TIM for the high temperature power electronics die attachment can be performed in a low-temperature (<250° C.), essentially pressure less manner and in an open-air atmosphere without the use of vacuum or inert gas protection. The novel TIM enables higher processing efficiency and lower energy costs due to lower sintering temperature requirements and the simplified tools/procedures involved. In particular, the novel TIM pastes can be applied to join with bare metal substrates such as copper substrates.

The novel hybrid Ag paste TIM of the present invention is particularly suited for use in WBG power devices that employ silicon carbide and/or gallium nitride semiconductors. By employing the novel TIM, WBG devices are capable to work in the temperature range 250-300° C., which fulfills the potentials as offered by WGB. This TIM address the needs of high/wide operation temperatures, high thermal conductivity and enhanced mechanical strength at room and elevated temperatures, and yet can be applied in low-coast and scalable process. In particular, the novel TIM has several advantages including: (1) high-melting temperature (960° C.); (2) low sintering temperature (250-300° C.); (3) higher thermal conductivities (240 W/m·k), leading to improved thermal performance.

Figure 2:
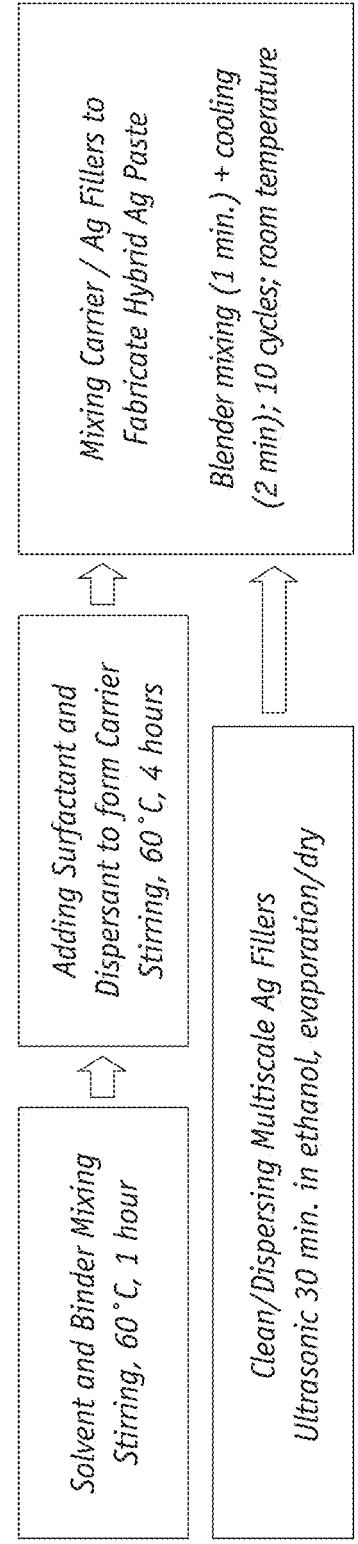
FIG. 2 depicts a process for preparing the Ag paste TIM.

The novel hybrid Ag paste TIMs can be processed in a cost-effective and scalable manner as summarized in FIG. 2 with good batch-to-batch consistency. In a typical process, the formulation of the hybrid Ag paste begins with preparing an α-terpineol based liquid carrier. Polymer binders such as EC and PVP are added into a container of α-terpineol solvent which is heated at polymer melting temperature of about 50-60° C. with a stirring speed of about 60-200 rpm. This relatively low speed is used because of the high viscosity of the mixture. A clear solution is obtained after about 2-6 hours. Surfactant and thinner such as oleic acid and toluene, respectively, are added to improve the filler dispersion and adjust the viscosity of the liquid carrier. The mixture continues to be heated and stirred for about another 1 to 2 hours.

In a separate operation, Ag fillers consisting of the multiscale Ag particles, metal-coated nanotubes, and Sn nanoparticles are mixed and well dispersed in a container of ethanol via ultrasonic treatment. The ethanol completely evaporated from the container by heating and stirring the Ag filler-ethanol mixture to achieve good homogeneity. The dried processed Ag fillers are then added into the liquid carrier and stirred for about 2-4 hours. Thereafter, the paste is further homogenized using a high-speed homogenizer for about 10-60 minutes at ambient temperature. For large batches, heavy-duty blinding or mixing method/equipment such as 3-roll mill mixer also can be used to process the pastes due to their high viscosities. The obtained novel Ag paste TIM is ready for use.

Figure 3:
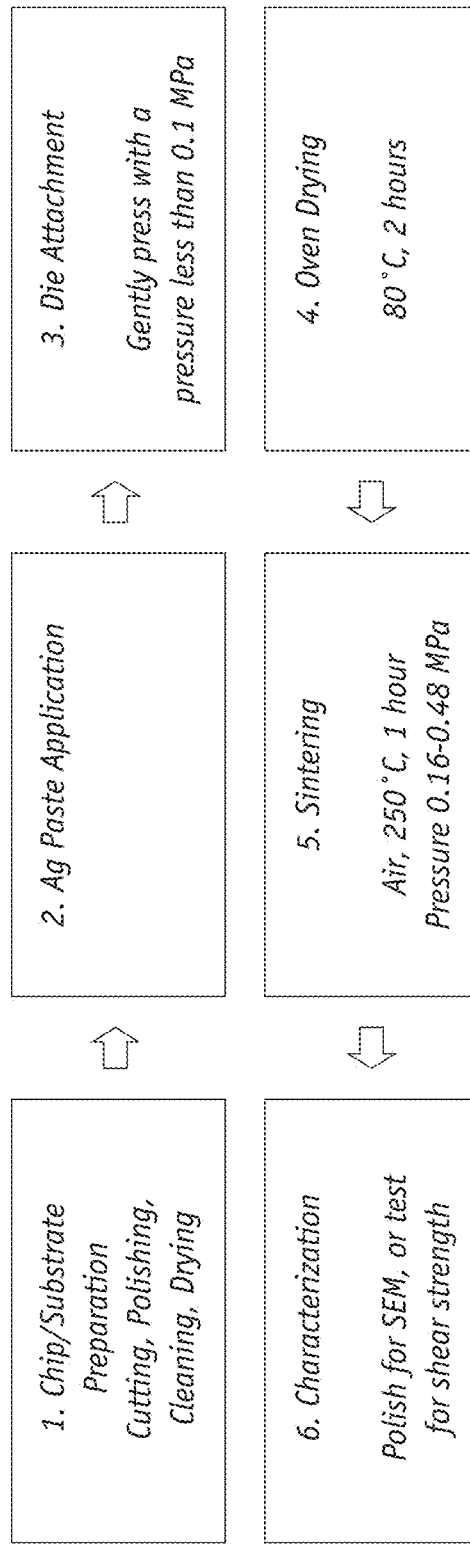
FIG. 3 depicts a process for preparing a sandwich structure using the Ag paste TIM.

The utility of the novel Ag paste TIM is demonstrated in a die attachment process that is depicted in FIG. 3 in constructing sandwich structures. Both dummy chips and substrates are cut out from a direct bond copper (DBC) plate (96% $Al_2O_3$ 0.025 inch (0.0635 cm), direct bonded Cu 0.012 inch (0.030 cm) on both sides). Dummy chips have dimensions of 3.3×3.3 mm and the substrate have dimensions of 8.5×25 mm. The chips and substrates are polished to shinning with sandpaper (800/2400 grit) and then ultrasonically cleaned for 5 min. in ethanol. The samples are further cleaned with a 1% HCl aqueous solution for 1 min. and then washed twice with ethanol. After being dried in a vacuum tube furnace for 1 hour at room temperature, the samples are ready for the paste application. For the DBCs with Ag or Au plating layers, the dummy chips and substrates are only washed and ultrasonically cleaned in acetone and ethanol for 10 min., respectively. These very thin samples (200-500 nm thickness) are not polished.

A stencil and blade coating technique, which simulates actual production line practices, is used to apply the Ag paste TIMs onto substrates. Stencils were made from ECHO brand green poly tape (Echo, Indianapolis, Ind.) with a thickness of 80 μm by cutting square holes (4×4 mm) thereon with a sharp-tip knife. After the stencil tape is placed on the substrate at a determined position (which is designed to facilitate the shear strength test), it is pressed firmly to remove the trapped air bubbles to ensure flatness. Thereafter, the novel Ag paste TIM is applied onto the stencil near the square hole and it is scrapped using a blade which is gently pressed to ensure that excess paste on the stencil is fully removed and the thickness of the paste in the hole is uniform. One strike of the blade is sufficient to establishing a good coating but another may be necessary to remove air bubbles from the edge of the paste.

Figure 4:
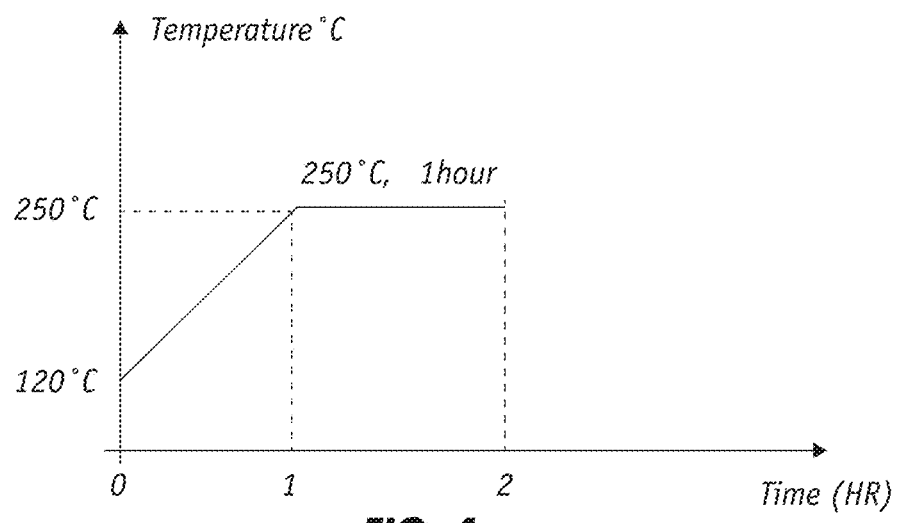
FIG. 4 is a heating profile for sintering the Ag paste TIM.

The dummy chip is then placed onto the paste layer and its position is adjusted using a designed fixture so that the top of the chip is parallel to the bottom edge of the substrate. This step facilitates the shear strength test described herein. Gently pressing the chip squeezes out a small of paste and removes trapped air bubbles between chip and paste. After the sandwich structure is dried in an oven at 80° C. for 2 hours, the entire assembly is fired in an air furnace where the oven temperature is raised from an initial 120° C. to 250° C. over an hour period and held at this temperature for another hour before being removed from the oven. The sintering temperature profile is shown in FIG. 4. After cooling to ambient temperature, the sandwich samples are ready for the subsequent tests and analysis.

Microstructure Characterization

Scanning electron microscopy (SEM) analysis was used to investigate the microstructure and morphology of the novel Ag paste TIMs under two conditions: (1) being dried but without sintering and (2) after being sintered.

Figure 5:
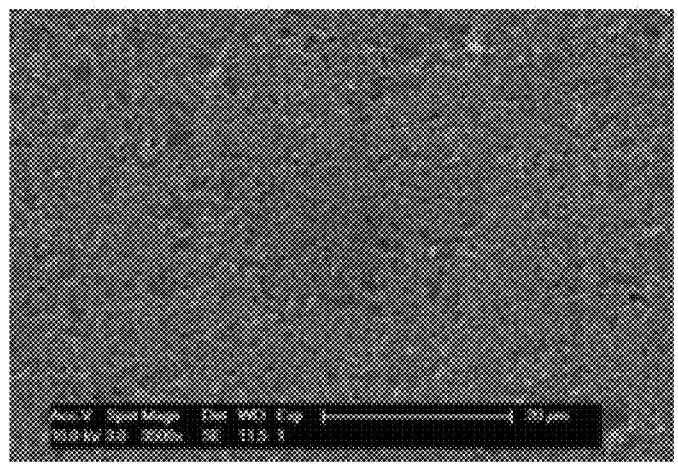
FIG. 5 is a SEM image of dried hybrid Ag paste TIM before sintering or firing.

FIG. 5 shows the SEM of a dried paste (before sintering or firing) wherein the hybrid fillers consisted of 32.0 wt % 80 nm Ag particles, 32.0 wt % 200 nm Ag particles, 32.0 wt % 1 μm particles, and 4.0 wt % metal-coated CNTs, which were coated with Ag particles of the size 5-20 nm. The dried paste was derived from a TIM composition comprising approximately 90 wt % of the hybrid fillers, 1.4 wt % of the polymer binders and 8.6 wt % liquid carrier, which included 6% α-terpineol and 2.6% toluene. The SEM image shows that the Ag filler particles and the binders are distributed uniformly, particularly for the particles with different dimensions. It is also observed there is no apparent aggregation or secondary larger structures, which indicate the good dispersion of Ag fillers in the carrier solvent. This is favorable for sintering fillers with high densities and improved thermal and mechanical properties, which has been confirmed by the subsequent characterization results. Uniform and dense Ag nanocoating CNTs are employed as an example in this invention. From FIG. 5, it is difficult to distinguish the nano-Ag coated CNTs because of their similarity to the Ag particles and small dimensions (CNTs can be found in the sintered Ag structures).

Figure 6A:
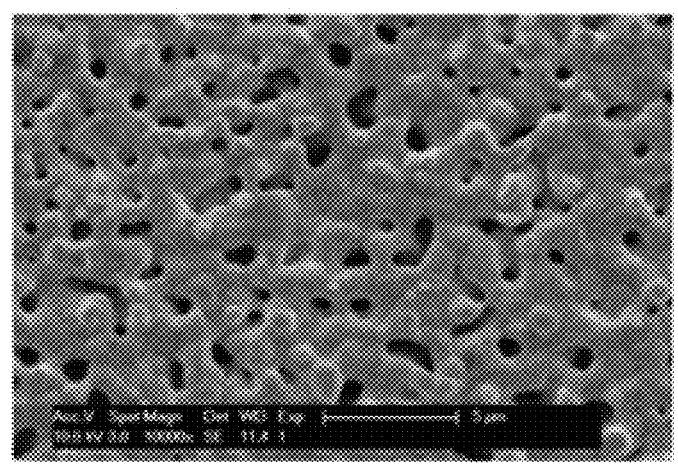
FIG. 6A is a SEM image of a sintered Ag paste TIM.
Figure 6B:
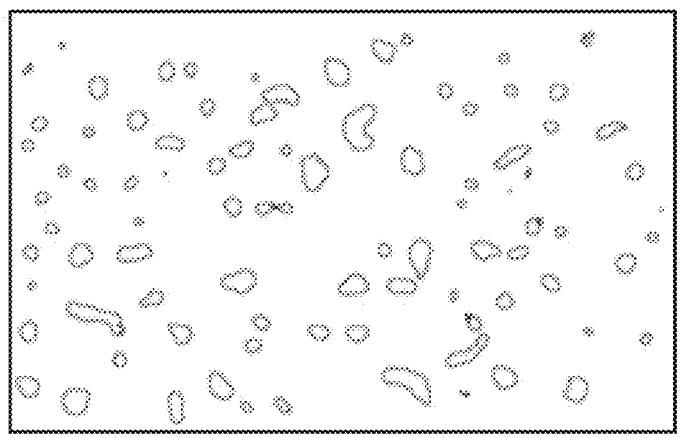
FIG. 6B is the porosity analysis of sintered Ag paste TIM.

FIG. 6A shows the SEM of a sintered sample wherein the fillers consisted of approximately 33.3 wt % 80 nm Ag particles, 33.3 wt % 200 nm Ag particles, 33.3 wt % 1 μm particles. There was no metal-coated CNTs. The sample was derived from a TIM composition comprising approximately 90 wt % of the multiscale Ag fillers, 1.4 wt % of the polymer binders and 8.6 wt % liquid carrier, which included approximately 6% α-terpineol and 2.6% toluene. This sample was processed using the heating profile as shown in FIG. 4. The sintered paste exhibits good uniformities, and the Ag particles with different scales are sintered together with obvious grain boundaries and relatively uniform pore sizes. The results of a computer porosity analysis of this sintered sample as shown FIG. 6B indicates a porosity of about 8%. This data means that using multiscale Ag particles can be used to achieve comparable or better properties than that of Ag nanoparticles only but with much lower costs.

Figure 7:
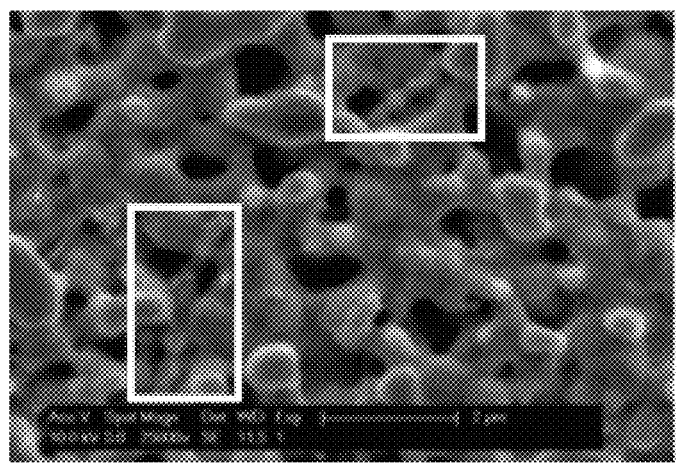
FIG. 7 is a SEM image of sintered Ag paste with the integrated CNTs shown within the frames.

With respect to the hybrid Ag filler sample of FIG. 5 that included the nano-Ag coated CNTs, very similar morphologies were achieved with respect to porosity and also for the average dimensions of grains and pores. Although the density of the hybrid sample was not as good as those of multiscale filler sample of FIG. 6A, it is obvious that the Ag particles have been sintered together with relatively short bridges. In addition, the metal-coated CNTs can be found in this sample, as shown in FIG. 7, which indicate the good compatibility between nano-Ag coated CNTs and Ag fillers with various dimensions.

Figure 8A:
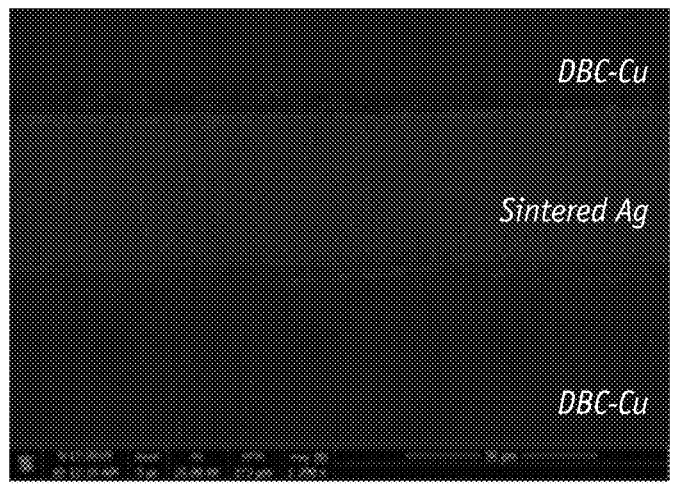
FIG. 8A is a SEM image (50 μm scale) of a cross-sectional view of a sandwich structure consisting of bare Cu layers on both chip and substrate and the sandwiched Ag layer.
Figure 8B:
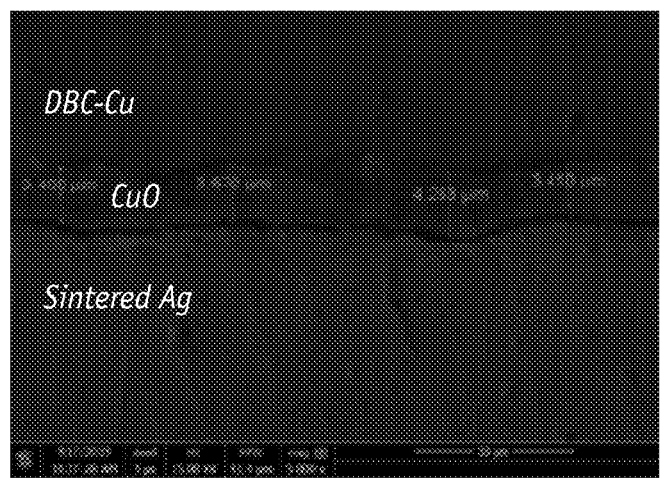
FIG. 8B is a SEM image (10 μm scale) of a cross-sectional view of a sandwich structure showing the CuO thin layer in the interface between bare Cu and sintered Ag layers.

The microstructure analysis of sintered sandwich structure was also conducted. The sintered sandwich structure was cut and polished to provide a cross-section view, according to a standard procedure for SEM sample preparation. FIG. 8 shows the cross-section view of a sandwich structure consisting of dummy chip, Ag paste TIM, and substrate layers, in which both of chip and substrate surfaces are bare Cu. From this image, it is apparent that the Ag paste has been sintered to relatively high density. In addition, very intimate interfacial contacts are established between Ag paste and bare Cu surfaces, indicating good attachment. Furthermore, as shown in FIG. 8B, there is a thin layer of CuO (with a thickness about 3-4 μm) between Ag sintering layer and Cu. This thin layer of CuO can provide additional anchoring to ensure that the joints are strongly bonded. The CuO thickness can be adjusted in order to optimize bonding based on its relations with the sintering process.

Figure 9A:
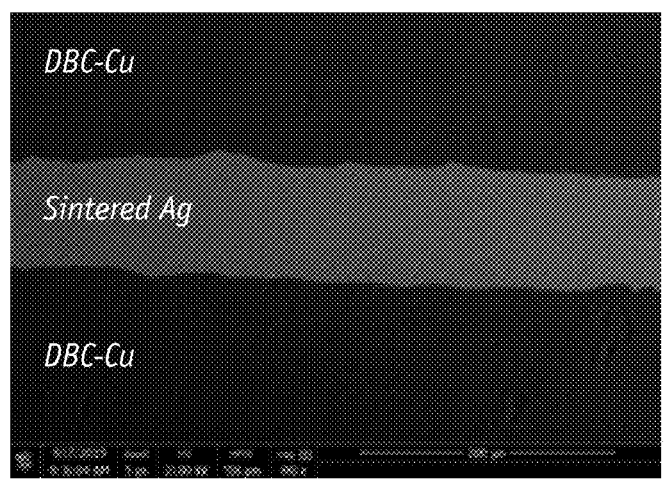
FIG. 9A is a SEM image (200 μm scale) of a cross-sectional view of a sandwich structure consisting of Ag-plated Cu layers on both chip and substrate and the sandwiched Ag layer.
Figure 9B:
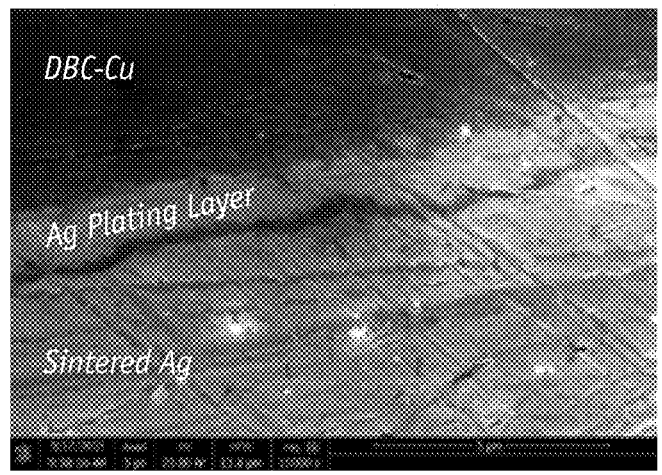
FIG. 9B is a SEM image (5 μm scale) of a cross-sectional view of a sandwich structure showing the Ag-plating layer between the DBC Cu and the sintered Ag layers.

FIG. 9 shows a similar cross-section view of a sandwich structure consisting of Ag plated DBC dummy chip and substrate. There is no CuO layer in the interface between sintered Ag and DBC Cu. In addition, it is difficult to distinguish the Ag plating layer from those sintered Ag paste. This can be attributed to the much easier self-diffusion of Ag to Ag than the inter-diffusion between Ag—Cu.

Mechanical (Shear) Strength Characterizations

Figure 10:
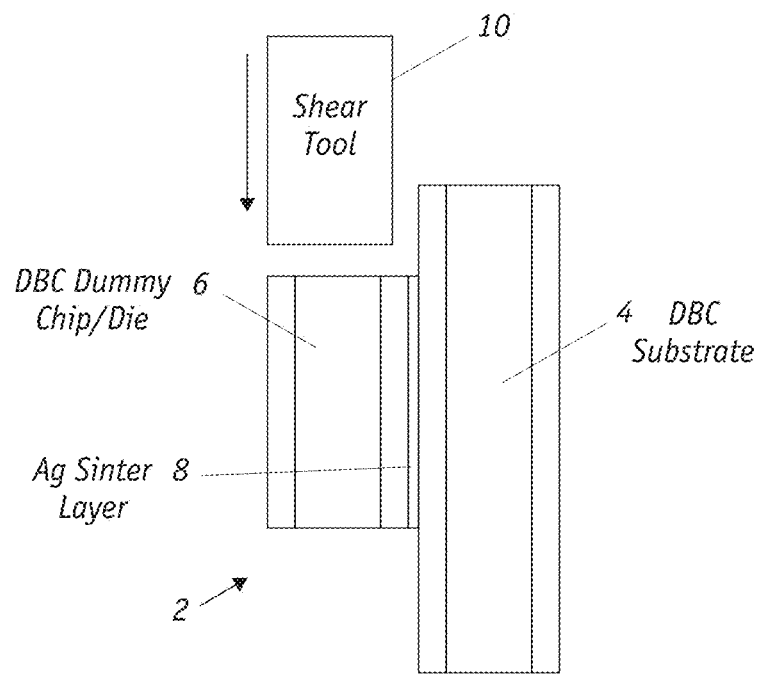
FIG. 10 is a schematic showing implementation of mechanical (shear) strength measurement.

A United STM 'SMART' test system from United Calibration which is a computerized tensile, compression, flexural test machine was used for shear strength measurements. As shown in FIG. 10, the sandwich structure 2 includes a DBC dummy chip or die that is attached by a layer of sintered layer 8 of the novel Ag paste TIM to DBC substrate 4. A shear tool of the test machine 10 applies a force to the DBC dummy chip 6.

Most of the shear strength results were achieved on the bare and Ag-plated Cu surfaces. The average strength achieved on bare Cu surfaces was about 28 MPa. On Ag-plated surfaces, even higher average strengths up to 36 MPa has been achieved. Both of these values have met and surpassed the requirements of electronic packaging (24

MPa) in practical applications, in which traditional lead and lead-free solders are dominant.

Figure 11:
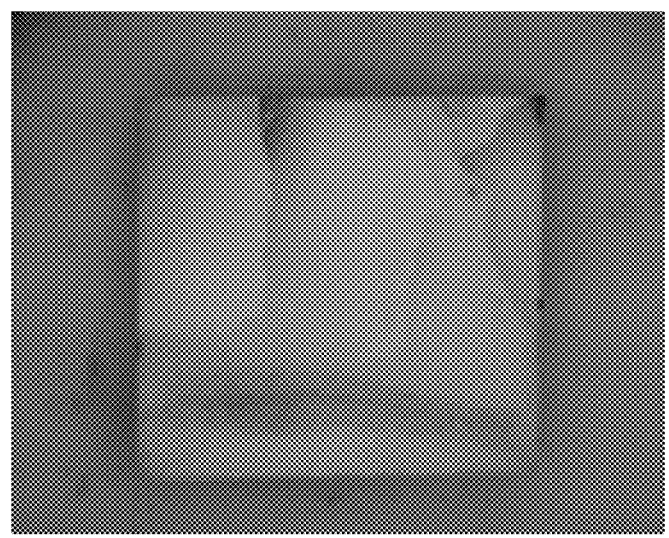
FIG. 11 is an optical image of a bottom side of a tested dummy chip (with the shear strength of 36.2 Mpa) showing a crack in the $Al_2O_3$ layer.

A visual examination of one tested dummy sample (36.2 MPa) using optical microscope is shown in FIG. 11. It can be seen that the failure is due to the crack of $Al_2O_3$ layer of the DBC dummy chip. These test results suggest that good joining performance have been achieved using the novel Ag paste TIMs, on both bare and Ag-plated Cu surfaces.

Figure 12:
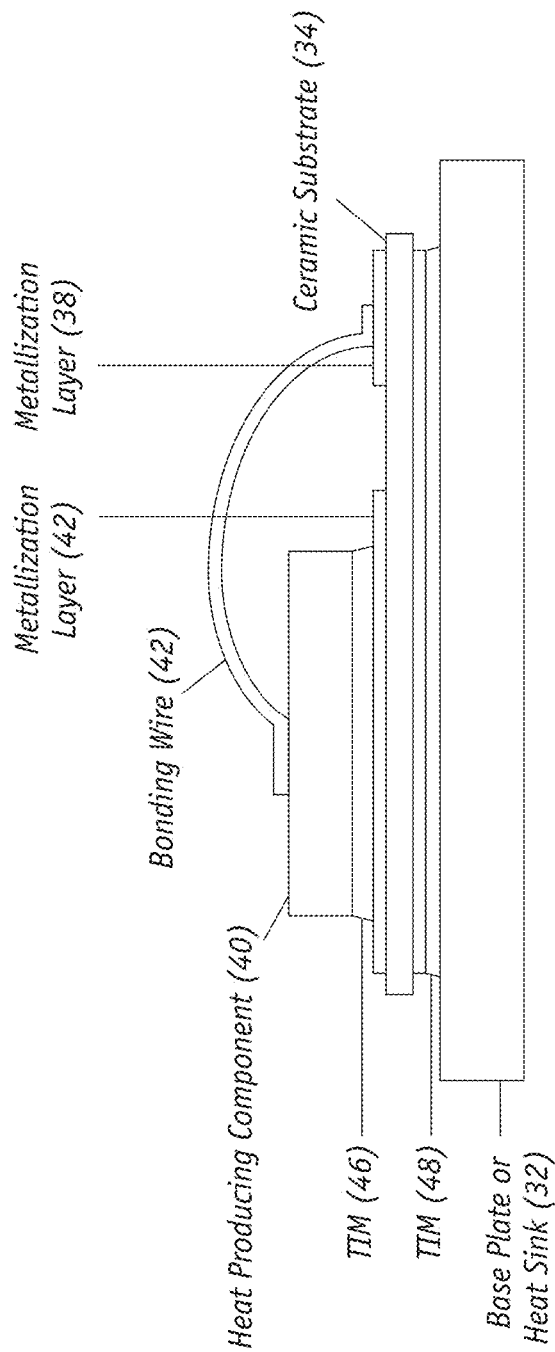
FIG. 12 is an electronic device wherein the components are attached with Ag paste TIM.

The Ag paste TIM of the present invention can be incorporated into various electronic devices. FIG. 12 depicts an electronic packaging structure 30 that includes a base plate or heat sink 32, ceramic substrate 34 with metallization layers 36, 38, and heat producing component 40. A bonding wire 42 connects heat producing component to metallization layer 34. TIM layer 46 attaches the heat producing component 40 to metallization layer 36 and TIM 48 attaches ceramic substrate 34 to base plate or heat sink 32.

The foregoing has described the principles, preferred embodiment and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of present invention as defined by the following claims.

What is claimed is:

1. A thermal interface material composition that comprises: (i) multiscale silver particles, (ii) metal-coated carbon nanotubes comprising carbon nanotubes that are plated with metal particles on an exterior surface of the carbon nanotubes, (iii) a polymer, and (iv) a liquid carrier wherein the multiscale silver particles, metal-coated carbon nanotubes and polymer are dispersed in the liquid carrier to form a paste.

2. The thermal interface material composition of claim 1 wherein the multiscale silver particles comprise nano-size silver particles with diameters between 10-100 nm, submicron-size silver particles with diameters between 0.1-1 μm, and micron-size silver particles with diameters between 1-10 μm.

3. The thermal interface material composition of claim 2 wherein the nano-size silver particles comprise 5.26 to 71.4 percent by weight of the multiscale silver particles and the submicron size silver particles comprise 6.67 to 81.8 percent by weight of the multiscale silver particles.

4. The thermal interface material composition of claim 1 further comprising Sn nanoparticles.

5. The thermal interface material composition of claim 1 wherein the metal-coated carbon nanotubes comprise carbon nanotubes that are plated with metal particles with diameters that range from 5 to 20 nm.

6. The thermal interface material composition of claim 1 wherein the metal-coated carbon nanotubes comprise carbon nanotubes that are plated with metal particles that are selected from the group consisting of Ag, Ni, Cu, Au, and mixtures thereof.

7. The thermal interface material composition of claim 1 wherein the polymer is selected from the group consisting of ethylene cellulose, polyvinylpyrrolidone, 2-ethylhexanoate, and mixtures thereof.

8. The thermal interface material composition of claim 1 wherein the liquid carrier comprises an organic solvent that is selected from the group consisting of α-terpineol, 4-(tert-butyl) cyclohexyl acetate, toluene, and mixtures thereof and surfactants that are selected from the group consisting of oleic acid, fish oil, octanoic acid, and mixtures thereof.

9. An electronic packaging component comprising: a heat producing component of a semiconductor device, a heat spreader or heat sink, and a thermal interface material interposed between the heat producing component and the heat spreader or heat sink, wherein the thermal interface material comprises (i) multiscale silver particles, (ii) metal-coated carbon nanotubes comprising carbon nanotubes that are plated with metal particles on an exterior surface of the carbon nanotubes, and (iii) a polymeric matrix wherein the multiscale silver particles and metal-coated carbon nanotubes are homogenously distributed in the polymeric matrix.

10. The electronic packaging component of claim 9 wherein the heat producing component comprises silicon carbide or gallium nitride.

11. The electronic packaging component of claim 9 wherein the multiscale silver particles comprise nano-size silver particles with diameters between 10-100 nm, submicron-size silver particles with diameters between 0.1-1 μm, and micron-size silver particles with diameters between 1-10 μm.

12. The electronic packaging component of claim 11 wherein the nano-size silver particles comprise 5.26 to 71.4 percent by weight of the multiscale silver particles and the submicron size silver particles comprise 6.67 to 81.8 percent by weight of the multiscale silver particles.

13. The electronic packaging component of claim 9 further comprising Sn nanoparticles.

14. A method of increasing heat transfer comprising: positioning a heat producing component in contact with a thermal interface material that comprises (i) multiscale silver particles, (ii) metal-coated carbon nanotubes comprising carbon nanotubes that are plated with metal particles on an exterior surface of the carbon nanotubes, (iii) a polymer, and (iv) a liquid carrier that comprises an organic solvent wherein the multiscale silver particles, metal-coated carbon nanotubes and polymer are dispersed in the liquid carrier to form a paste; positioning a heat sink in contact with the thermal interface material; and sintering the thermal interface material to remove the organic solvent and polymer to form a silver matrix in which the multiscale silver particles and metal-coated carbon nanotubes are homogenously distributed and wherein the multiscale silver particles are sintered with metal particles on the exterior surface of the carbon nanotubes.

15. The method of claim 14 further comprising sintering the thermal interface material at a temperature of 250 to 300° C.

16. The method of claim 15 wherein sintering occurs in the presence of oxygen.

17. The method of claim 14 wherein the heat producing component comprises silicon carbide or gallium nitride.

18. The method of claim 14 wherein the multiscale silver particles comprise nano-size silver particles with diameters between 10-100 nm, submicron-size silver particles with diameters between 0.1-1 μm, and micron-size silver particles with diameters between 1-10 μm.

19. The method of claim 18 wherein the nano-size silver particles comprise 5.26 to 71.4 percent by weight of the multiscale silver particles and the submicron size silver particles comprise 6.67 to 81.8 percent by weight of the multiscale silver particles.

20. The method of claim 14 the thermal interface material comprises Sn nanoparticles.

21. The method of claim 14 wherein the silver matrix consists essentially of the multiscale silver particles and the metal-coated carbon nanotubes.

22. A thermal interface material composition that comprises: (i) multiscale silver particles, (ii) metal-coated carbon nanotubes comprising carbon nanotubes that are plated with metal particles on an exterior surface of the carbon nanotubes, (iii) a polymer, and (iv) a liquid carrier wherein the multiscale silver particles, metal-coated carbon nanotubes and polymer are dispersed in the liquid carrier to form a paste and wherein the metal-coated carbon nanotubes are produced by a method comprising: (a) providing de-bundled and disentangled carbon nanotubes; (b) sensitizing the carbon nanotubes by mixing said de-bundled and disentangled carbon nanotubes in an aqueous sensitizer solution to yield sensitized carbon nanotubes; and (c) plating the sensitized carbon nanotubes in a metal solution to yield metal-coated carbon nanotubes.

23. The thermal interface material composition of claim 22 wherein the metal-coated carbon nanotubes comprise carbon nanotubes that are plated with metal nanoparticles on an exterior surface of the carbon nanotubes.

24. The thermal interface material composition of claim 23 wherein the metal-coated carbon nanotubes comprising metal nanoparticles having thickness of in the range of 5 to 100 nm.

\* \* \* \* \*